(12) United States Patent
Tormey et al.

(10) Patent No.: US 7,451,073 B2
(45) Date of Patent: Nov. 11, 2008

(54) SYSTEM AND METHOD FOR INCREASING PERFORMANCE IN MULTI-CPU SIMULATION

(75) Inventors: Daniel Tormey, Richardson, TX (US); Joe Bolding, Allen, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1233 days.

(21) Appl. No.: 10/178,967

(22) Filed: Jun. 25, 2002

(65) Prior Publication Data

US 2003/0237076 A1 Dec. 25, 2003

(51) Int. Cl.
*G06F 9/45* (2006.01)

(52) U.S. Cl. ............................ 703/22; 703/17; 717/131; 717/135; 718/103; 718/104; 718/105; 718/107; 719/328

(58) Field of Classification Search .................... 703/6, 703/13, 17, 22, 19; 719/328; 709/219, 201, 709/213, 248; 717/131, 134, 135; 718/100, 718/102–107
See application file for complete search history.

(56) References Cited

U.S. PATENT DOCUMENTS

| | | | |
|---|---|---|---|
| 4,939,507 A * | 7/1990 | Beard et al. | 345/156 |
| 5,113,517 A * | 5/1992 | Beard et al. | 703/23 |
| 6,286,080 B1 * | 9/2001 | Galbraith et al. | 711/113 |
| 2002/0026502 A1 * | 2/2002 | Phillips et al. | 709/219 |

OTHER PUBLICATIONS

Phillips et al., C.I. Concurrent Discrete Event-Driven Simulation Tools, IEEE Journal on Selected Areas in Communications, vol. 9, No. 3, Apr. 1991, pp. 477-485.*
Campos et al., L.M. Rate of Change Load Balancing in Distributed and Parallel Systems, 13th International and 10th Symposium on Parallel and Distributed Processing, 1999 IPPS/SPDP Proceedings, Apr. 1999, pp. 701-707.*
Tridandapani et al., S. Free Performance and Fault Tolerance Using System Idle Capacity Efficiently, Proceedings of the 1995 ACM SIGMETRICS Joint International Conference on Measurement and Modeling of Computer Systems, ACM Press, May 1995, pp. 60-61.*
Nichols, D. Using Idle Workstations in a Shared Computing Environment, Proceedings of the 11th ACM Symposium on OPerating Systems Princples SOSP '87, ACM Press, Nov. 1987, pp. 5-12.*
Acharya et al., A. The Utility of Exploiting Idle Workstations for Parallel Computation, Proceedings of the 1997 ACM SIGMETRICS International Conference on Measurement and Modeling of Computer Systems, ACM Press, Jun. 1997, pp. 225-236.*
Lu et al., Y.-H. Requestor-Aware Power Reduction, Proceedings of the 13th Inrernational Symposium on System Synthesis, Sep. 2000, pp. 18-23.*

(Continued)

*Primary Examiner*—Russell Frejd (57) ABSTRACT

A system and method for increasing performance in a simulator environment operable to simulate a multiprocessor platform with program code running thereon. A set of processors are initialized upon instantiating the simulator environment on a host machine for executing the program code instructions. Code execution on a simulated processor is suspended by executing a simulator API routine which is called when the program code is to enter an idle state. The host resources that would otherwise have been spent on the processor running the idle loops are therefore conserved for use by the remaining processors.

24 Claims, 6 Drawing Sheets

OTHER PUBLICATIONS

Sanguinetti , J. A Technique for Integrating Simulation and System Design, 1979 Conference on Simulation, Measurement and Modeling of Computer Systems, pp. 163-172.*

Binder et al., W. Portable Resource Control in Java, Proceedings of the 16th ACM SIGPLAN Conference on Object Oriented Programming, Systems, Languages and Applications, Oct. 2001, pp. 139-155.*

Buyya et al., R. A Case for Economy Grid Architecture for Service Oriented Grid Computing, IEEE Proceedings 15th International Parallel and Distributed Processing Symposium Apr. 2001, pp. 1-15.*

Agnihotri et al., P. The Penn State Computing Condominium Scheduling System, Proceedings of the 1998 ACM/IEEE Conference on Supercomputing, Nov. 1998, pp. 1-32.*

Fujimoto, R.M. Parallel Discrete event Simulation, Communication of the ACM, Oct. 1990, pp. 30-53.*

* cited by examiner

SYSTEM AND METHOD FOR INCREASING PERFORMANCE IN MULTI-CPU SIMULATION

CROSS-REFERENCE TO RELATED APPLICATION(S)

This application discloses subject matter related to the subject matter disclosed in the following commonly owned patent application(s): (i) "System And Method For Increasing Os Idle Loop Performance In A Simulator," filed even date herewith, application Ser. No. 10/178,992, now published as U.S. Patent Application Publication No. 2003/0237075, in the name(s) of: Daniel Tormey, Joe Bolding and Matt Jacunski.

BACKGROUND OF THE INVENTION

1. Technical Field of the Invention

The present invention generally relates to computer systems. More particularly, and not by way of any limitation, the present invention is directed to a system and method for increasing performance in a multi-CPU simulator environment.

2. Description of Related Art

Architectural simulators are often used to simulate a target hardware platform, whereby a simulated execution environment can "execute" a particular piece of software intended for the target hardware as if it were run on the actual machine itself. The target hardware platform may be comprised of any known computer architecture. For various reasons, simulators operable to simulate multiprocessor (MP) computer systems are more prevalent. Because the teachings of the present invention are particularly exemplified within the context of MP platforms, a brief introduction thereto is immediately set forth below.

In the most general sense, multiprocessing may be defined as the use of multiple processors to perform computing tasks. The term could apply to a set of networked computers in different locations, or to a single system containing several processors. As is well known, however, the term is most often used to describe an architecture where two or more linked processors are contained in a single or partitioned enclosure. Further, multiprocessing does not occur just because multiple processors are present. For example, having a stack of personal computers in a rack is not multiprocessing. Similarly, a server with one or more "standby" processors is not multiprocessing, either. The term "multiprocessing" is typically applied, therefore, only to architectures where two or more processors are designed to work in a cooperative fashion on a task or set of tasks.

There exist numerous variations on the basic theme of multiprocessing. In general, these variations relate to how independently the processors operate and how the workload among these processors is distributed. In loosely-coupled multiprocessing architectures, the processors perform related tasks but they do so as if they were standalone processors. Each processor is typically provided with its own private memory and may have its own mass storage and input/output (I/O). Further, each loosely-coupled processor runs its own copy of an operating system (OS), and communicates with the other processor or processors through a message-passing scheme, much like devices communicating over a local area network. Loosely-coupled multiprocessing has been widely used in mainframes and minicomputers, but the software to effectuate MP activity is closely tied to the hardware design. For this reason, among others, it has not gained the support of software vendors and is not widely used in today's high performance server systems.

In tightly-coupled multiprocessing, on the other hand, operation of the processors is more closely integrated. They typically share main memory, and may even have a shared cache. The processors need not be identical to one another, and may or may not perform similar tasks. However, they typically share other system resources such as mass storage and I/O. Additionally, instead of a separate copy of the OS for each processor, they run a single copy, with the OS handling the coordination of tasks between the processors. The sharing of system resources makes tightly-coupled multiprocessing platforms somewhat less expensive, and it is the dominant multiprocessor architecture in the business-class servers currently deployed.

Hardware architectures for tightly-coupled MP platforms can be further divided into two broad categories. In symmetrical MP (SMP) systems, system resources such as memory, disk storage and I/O are shared by all the microprocessors in the system. The workload is distributed evenly to available processors so that one does not sit idle while another is heavily loaded with a specific task. Further, the SMP architecture is highly scalable, i.e., the performance of SMP systems increases, at least theoretically, as more processor units are added.

In asymmetrical MP (AMP) systems, tasks and resources are managed by different processor units. For example, one processor unit may handle I/O and another may handle network OS (NOS)-related tasks. Thus, it should be apparent that an asymmetrical MP system may not balance the workload and, accordingly, it is possible that a processor unit handling one task can be overworked while another unit sits idle.

SMP systems are further subdivided into two types, depending on the way cache memory is implemented. "Shared-cache" platforms, where off-chip (i.e., Level 2, or L2) cache is shared among the processors, offer lower performance in general. In "dedicated-cache" systems, every processor unit is provided with a dedicated L2 cache, in addition to its on-chip (Level 1, or L1) cache memory. The dedicated L2 cache arrangement accelerates processor-memory interactions in the multiprocessing environment and, moreover, facilitates better scalability.

Regardless of which type of the target platform is simulated, a simulator is typically run on a host machine that may itself be a high-performance computer system having MP capability. During the execution of the simulator and any code run on the simulated platform, the host machine expends its own resources, e.g., processor cycles, memory accesses, and the like, in order to execute the simulator software. Clearly, how effective and efficient a simulator is with respect to a target hardware platform depends on how it is run on the host machine, which in turn is based on how the host resources are utilized in the process of effectuating a simulation environment.

It should be readily apparent that consumption and conservation of host resources can be particularly critical where a multi-CPU platform is being simulated for executing a specific piece of software (also referred to as code under simulation). In a conventional simulation environment, when a simulated processor is in an idle loop during the execution of the code under simulation, the host machine resources continue to be used up, thereby reducing the performance of the simulator. This situation is especially wasteful in a single-threaded simulator environment supporting a multi-CPU target platform because each simulated CPU consumes the same amount of available host resources even when executing idle loops.

SUMMARY OF THE INVENTION

Accordingly, the present invention advantageously provides a system and method for increasing performance in a simulator environment operable to simulate a multiprocessor platform with program code running thereon. A set of simulated processors are initialized upon instantiating the simulator environment on a host machine for executing the program code instructions. Code execution on a simulated processor is suspended upon encountering an idle state in the program code running on that simulated processor. The host resources that would have otherwise been spent on the simulated processor running the idle loops are therefore conserved for use by the remaining simulated processors.

In an exemplary embodiment, a simulator application program interface (API) routine is provided for suspending or re-activating a simulated processor. The API routine is operable to include at least two arguments, one for identifying a particular processor of a processor list that is to be suspended or re-activated and another argument that specifies which action is to take place with respect to the identified processor.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
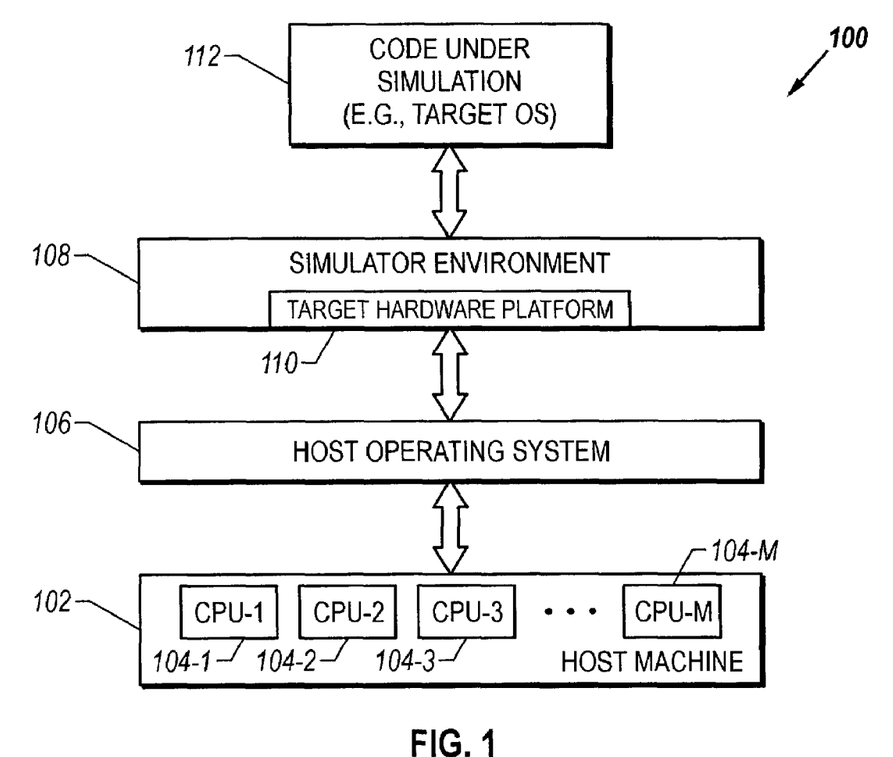
FIG. 1 depicts an exemplary simulator environment wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is an exemplary simulator system 100 wherein the teachings of the present invention may be advantageously practiced for increasing the performance and efficiency therein. A host machine 102 is provided for executing any known or heretofore unknown simulator operable to simulate a target hardware platform. The host machine's hardware may be architected to include one or more processors, in addition to other known devices such as, e.g., timers, input/output (I/O) devices, co-processors, accelerators, system storage, et cetera. Reference numerals 104-1 through 104-M refer to a plurality of processors (CPU-1 through CPU-M) of the host machine, which may be implemented in any known multiprocessor (MP) computer system configuration. A host Operating System (OS) 106 running on the host machine 102 is operable to support a simulator environment 108 that is specific to a selected target platform. Reference numeral 110 refers to an exemplary target platform simulated by the simulator, which platform comprises, in one implementation, a multi-CPU computer system having two or more simulated processors (SCPUs). Thus, the simulated target hardware platform 110 can be any of known or heretofore unknown MP environments including loosely- or tightly-coupled MP systems, symmetrical or asymmetrical MP architectures, and the like.

The simulator environment 108 is operable to execute program code (i.e., code under simulation) 112 intended to run on a target platform, e.g., an OS or application program. Accordingly, the code under simulation is run on the simulated processors of the exemplary target hardware platform 110. The various simulated processors are thus operable to execute the instructions of the program code by effectuating fetch/execute (F/E) cycles in some order as the time progresses. For instance, the execution flow may be initiated at a first simulated processor with one F/E cycle, the next simulated processor executing the following F/E cycle, and so on, until the first simulated processor re-commences whichever F/E cycle it encounters in the program. As these F/E cycles are effectuated in the simulator environment 108, the underlying host resources themselves, e.g., host CPUs, memory, etc., are consumed also. Those skilled in the art should recognize that the issue of how resource consumption impacts the host machine 102 is dependent at least in part upon whether the simulator running on the host machine 102 is a single-threaded application (i.e., run on a single host CPU) or a multi-threaded application (i.e., run on two or more host CPUs).

Figure 2:
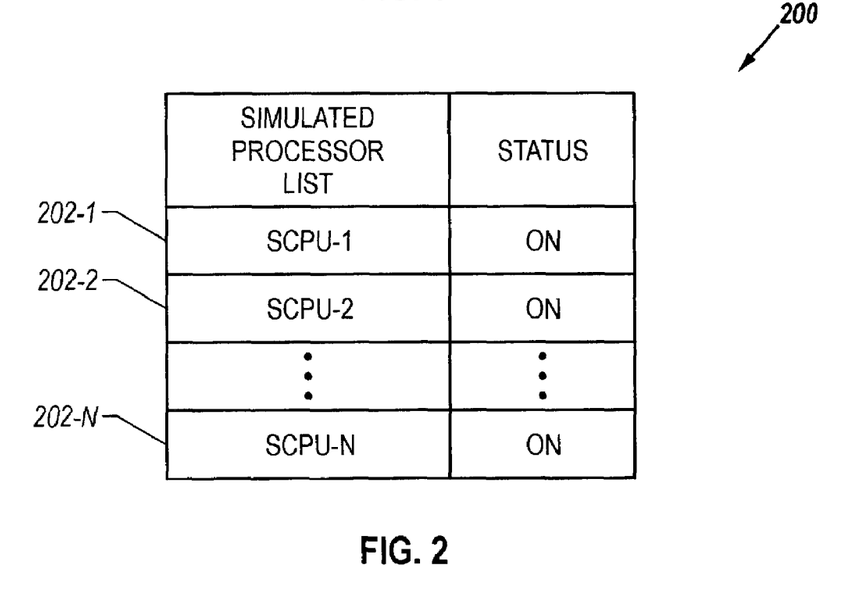
FIG. 2 depicts a list of simulated processors upon initialization in an exemplary simulator environment.

In general, when the simulator environment is instantiated on the host machine, a plurality of simulated processors are initialized as part of specifying the target hardware platform. When a program is executed in the simulator environment, in one implementation, a "run list" of the simulated CPUs is maintained for executing the program code under simulation. FIG. 2 depicts an exemplary list 200 of simulated processors activated upon initialization in a simulated environment such as the environment 108 described in the foregoing discussion. Reference numerals 202-1 through 202-N refer to N simulated processors (SCPU-1 through SCPU-N) that are maintained in a suitable database structure, which may be implemented in hardware, software, firmware, or in any combination thereof. A status indicator is associated with each SCPU for identifying whether a particular processor is available as part of the run list for executing a program under simulation.

Figure 3:
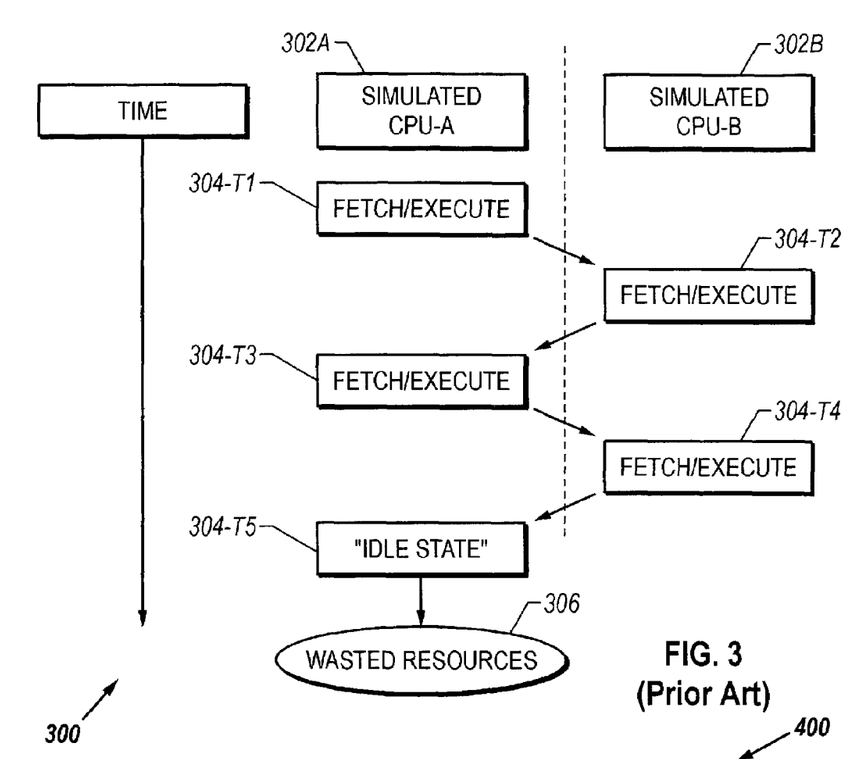
FIG. 3 (Prior Art) depicts a conventional program flow in a simulator system having two simulated processors.

Referring now to FIG. 3, depicted therein is a conventional program flow 300 in a simulated system having two processors, CPU-A 302A and CPU-B 302B. For purposes of illustration, when suitable code under simulation is executed on the simulated target platform, a Fetch/Execute cycle 304-T1 is effectuated by CPU-A 302A at time T1. Thereafter, the execution flow may be switched to CPU-B 302B which effectuates another Fetch/Execute cycle 304-T2 at time T2. Likewise, as the runtime progresses, the execution flow may go back and forth between the two processors as the program code instructions are executed in the simulated platform. Reference numerals 304-T3 and 304-T4 refer to two additional exemplary F/E cycles executed by the processors 302A and 302B, respectively at times T3 and T4.

At time T5, CPU-A 302A encounters the program code at a point that causes an "idle" condition in the execution state. That is, for example, the simulated processor CPU-A enters a state wherein it is forced to execute a number of idle loops instead of doing any "useful" work. Such a condition may arise due to an inherent feature of the program code itself, or may be artificially introduced in order to simulate a situation in which a target processor may enter into an "indeterminate" state for a period of time whereby the processor is "out of the loop" as far as the program execution is concerned. Thus, in one implementation, such idle loop phases may comprise standard, internal idle loops that the program code may typically be provided with in order that certain asynchronous events (e.g., an I/O event) take place before continuing. Also, idle loops may be inserted in the program code at selected points as alluded to hereinabove. Regardless of how they are implemented, the idle states in general have a starting point and an ending point. Also, although a simulated processor is in the mode of executing idle loops when an idle state is encountered, the underlying host resources continue to be consumed, however. For example, memory accesses by the host processor(s) necessary to support the loop execution by the simulated processor may continue to exist. Further, any conditionalities associated with the idle loop execution must also be verified by the host processor(s). As a result, the host machine resources are unnecessarily wasted on the simulated processor 302A when it is in the idle state, which resources could have been put to use for the other simulated processors. Reference numeral 306 symbolically refers to the host resource wastage with respect to the idle state of CPU-A 302A. As pointed out earlier, the effect of wasted resources is particularly significant when the simulator environment is provided as a single-threaded simulator running on one host CPU.

Figure 4:
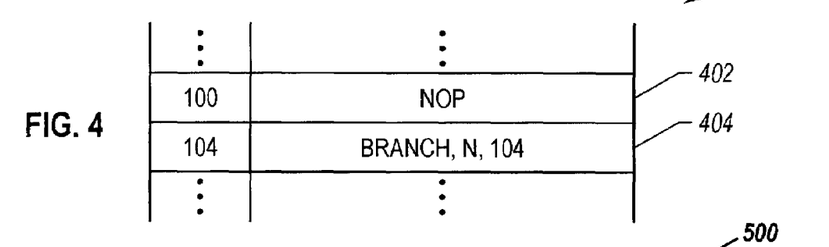
FIG. 4 depicts a code portion in an exemplary program code under simulation that can cause an idle loop condition in a simulated processor.

FIG. 4 depicts a code portion 400 in an exemplary program code under simulation that can cause an idle loop condition in a simulated processor, e.g., CPU-A 302A shown in FIG. 3. Reference numeral 402 refers to a NOP instruction, which is followed by a BRANCH statement 404. The arguments of the BRANCH statement are such that program control continues to return to the same instruction repeatedly.

Figure 5:
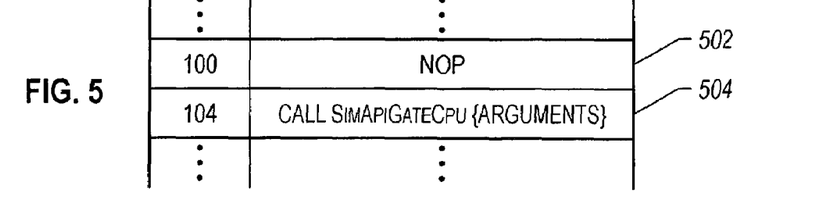
FIG. 5 depicts an exemplary code portion provided in accordance with the teachings of the present invention that avoids wastage of host resources caused by the idle loops in multi-CPU simulation.

FIG. 5 depicts an exemplary code portion 500 provided in accordance with the teachings of the present invention that avoids host resource wastage caused by the idle loops in multi-CPU simulation. Reference numeral 502 refers to a conventional NOP instruction. A simulator application program interface (API) routine 504 is provided in the program code that can activate or suspend a particular simulated processor. In one exemplary embodiment, the routine is implemented as SimApiGateCpu{Arguments} wherein at least two arguments are provided, one argument being an indicator that identifies which processor is the target of the call and another argument being an activity indicator that specifies whether the targeted processor is to be suspended or resumed (i.e., re-activated). Preferably, the routine 504 may be executed by a targeted processor itself (when not suspended) or by another processor of the processor run list initialized upon instantiation of a simulator environment. In one configuration, the targeted processor that has been suspended due to the execution of the routine 504 is effectively deactivated from the simulator's run list and thus does not consume any host machine execution resources. The initial run list may accordingly be modified to indicate the deactivated status of the suspended processor(s). In another implementation, the suspended processors may not appear in the simulator's processor run list at all. Regardless of the implementational variations, however, code execution on a simulated processor can be suspended responsive to the activity indicator argument of the SimApiGateCpu routine.

Accordingly, for instance, CPU-A 302A of FIG. 3 may be suspended by executing SimApiGateCpu{A,Suspend} either on CPU-A itself or on any other processor of the list (e.g., CPU-B). Suspended CPU-A may be re-activated by executing SimApiGateCpu{A,Resume} on CPU-B. As a further variation, a suspended processor may continue to be responsive to certain external events in the simulator environment, which events may re-activate the suspended processor and place it back on the run list. For example, a suspended processor may be provided with the capability to receive interrupts (IRQs) from any source, and a received interrupt can re-activate the suspended processor. In one arrangement, the structure operable to maintain the simulator's processor run list may have the capability to indicate which suspended processor(s) is (are) amenable to re-activation by external events. Preferably, regardless of how a suspended processor is brought back online, that processor's state is modified to appear as if it was never suspended.

Figure 6:
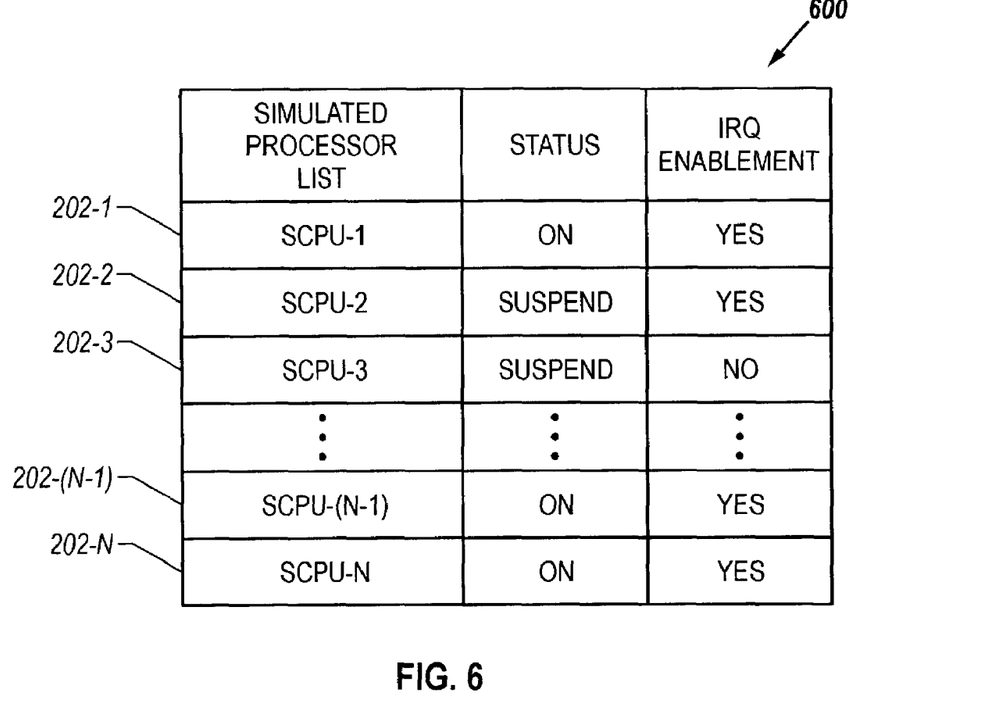
FIG. 6 depicts an exemplary modified processor list illustrating the condition wherein a simulator processor with idle loops is suspended.

Referring now to FIG. 6, depicted therein is an exemplary modified processor list structure 600 that illustrates the condition where a simulated processor with idle loops is suspended in a multi-CPU simulation environment. As before, reference numerals 202-1 through 202-N refer to N SCPUs (SCPU-1 through SCPU-N) SCPU-2 202-2 and SCPU-3 202-3 exemplify two processors that have been suspended in accordance with the teachings of the present invention. The processor list structure 600 further indicates the capability of the suspended processors to receive IRQs, e.g., I/O IRQs, inter-processor IRQs, and the like. By way of illustration, suspended SCPU-2 is enabled to receive IRQs, whereas suspended SCPU-3 is not.

Figure 7:
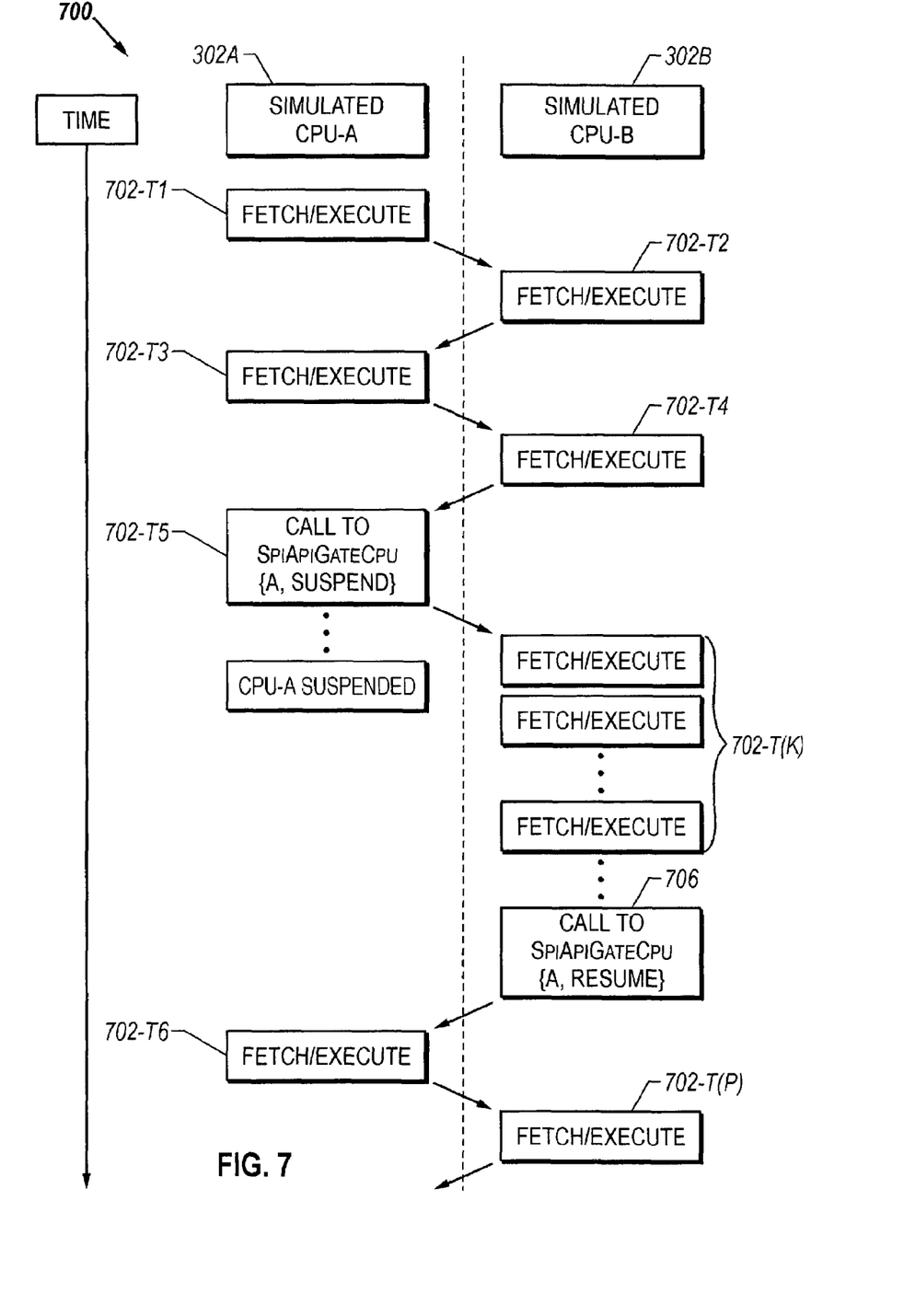
FIG. 7 depicts an exemplary program flow in a simulator system having two simulated processors wherein a processor is suspended in accordance with the teachings of the present invention.

FIG. 7 depicts an exemplary program flow 700 in a simulator system having two simulated processors, e.g., the two-CPU system with CPU-A and CPU-B described above, wherein a processor is suspended in accordance with the teachings of the present invention. Analogous to the execution flow shown in FIG. 3, reference numerals 702-T1 through 702-T4 refer to a plurality of F/E cycles effectuated by CPU-A 302A and CPU-B 302B. It should be understood that although the F/E cycles are shown to alternate between the two processors, the cycles may occur in any order as the runtime advances. Upon identifying or otherwise determining that CPU-A 302A is to encounter an idle state at time T5, the SimApiGateCpu routine of the present invention is called with the arguments identifying CPU-A as the processor targeted for SUSPEND action. While CPU-A remains suspended, the program code under simulation continues to be executed on the remaining processor, i.e., CPU-B 302B. Reference numeral 702-T(K) refers to an exemplary set of F/E cycles executed on CPU-B while CPU-A is suspended.

Thereafter, upon expiration of a predetermined time according to one implementation, the simulator API routine SimApiGateCpu{A,Resume} 706 is called to be executed on CPU-B 302B in order to resume program execution activity on the suspended CPU-A 302A. As a result, CPU-A is re-activated for program execution 702-T6 at time T6. Subsequently, the execution flow continues by way of effectuating program F/E cycles on all active CPUs. Reference numeral 702-T(P) symbolically refers to these F/E cycles.

Figure 8A:
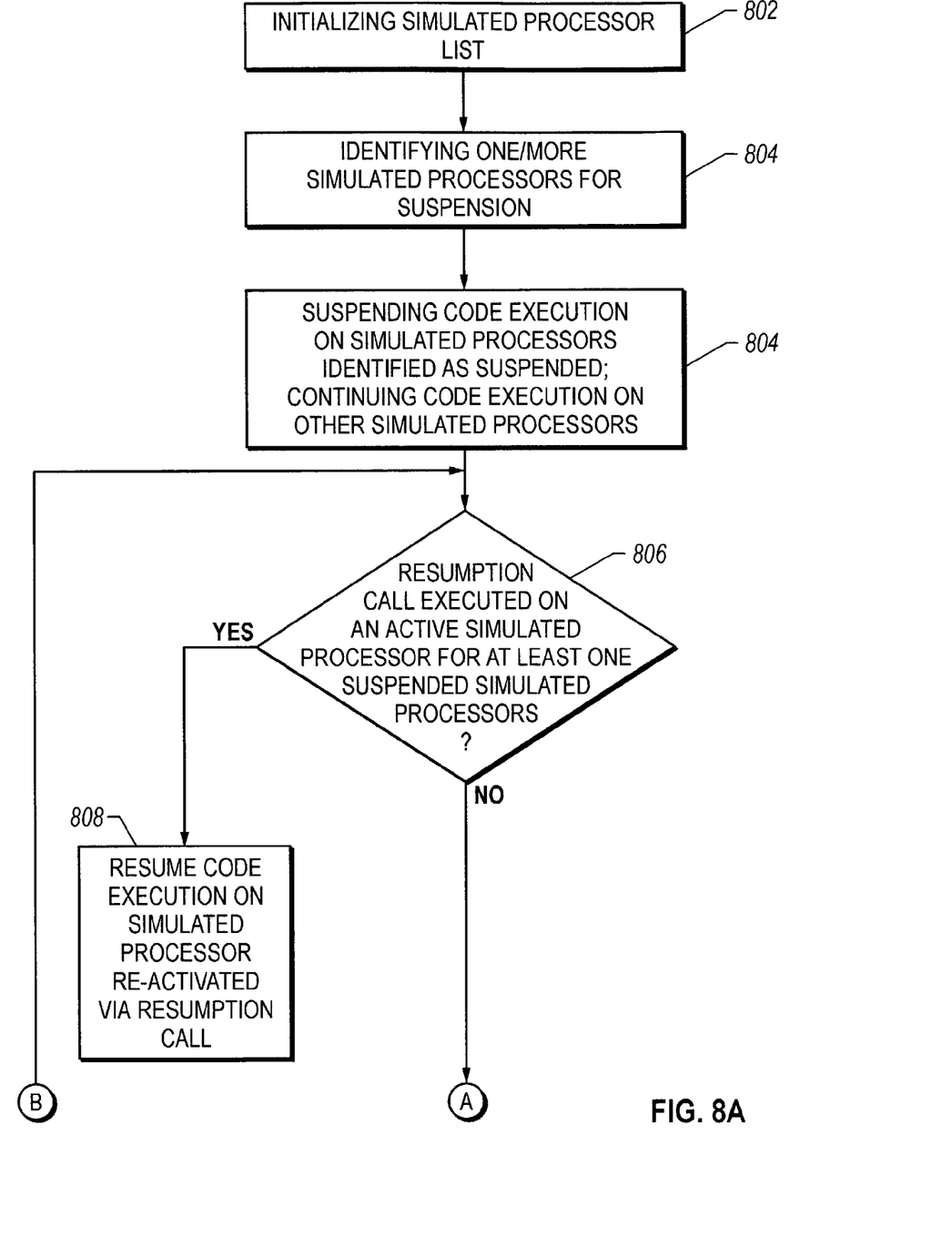
FIGS. 8A and 8B are a flow chart of the steps involved in an exemplary methodology of the present invention to increase the idle loop performance in a multi-CPU simulator environment.
Figure 8B:
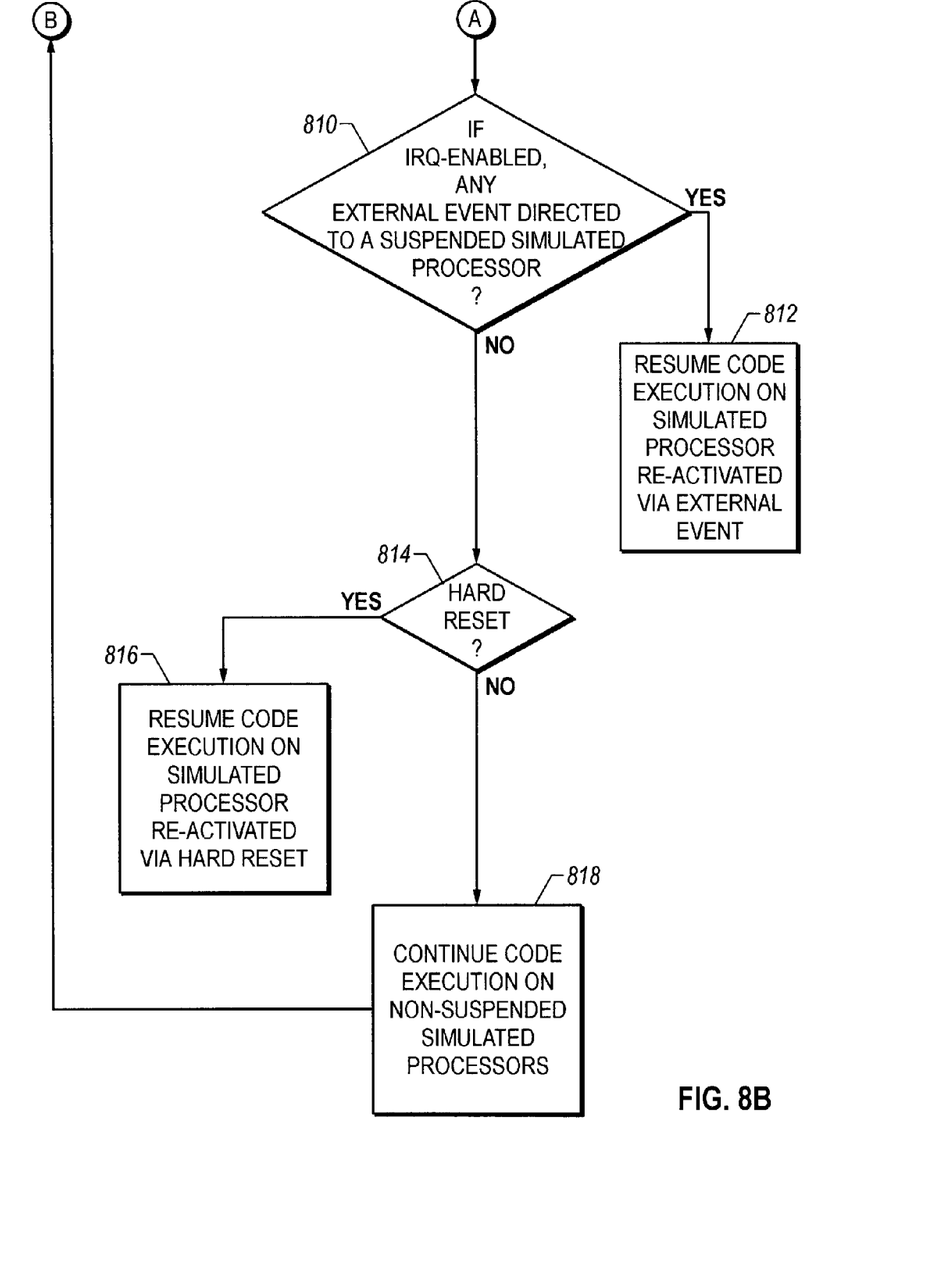

FIGS. 8A and 8B are a flow chart of the various steps involved in an exemplary methodology of the present invention to increase the idle-loop performance in a multi-CPU simulator environment. As alluded to hereinabove, a list of processors are initialized upon instantiating an architectural simulator for a target hardware platform on a host machine (step 802). During the execution of program code under simulation, one or more simulated processors of the target platform may be identified, manually or automatically, as candidates for suspension as they encounter idle loop conditions in the program code (step 804). The processors identified for suspension are then deactivated, whereby code execution thereon is suspended. On the other hand, the remaining processors of the target platform continue to execute the program in the simulator environment. These processes are consolidated as step 804.

Depending on implementation, one or more determinations are made whether at least one suspended processor is re-activated by way of a resumption call executed on an active processor (decision block 806) or by way of an external event directed to a suspended processor that is capable of receiving such an event (decision block 810). As set forth in detail hereinabove, the resumption call is effectuated as a SimApi-GateCpu{ } routine which identifies a suspended processor targeted for re-activation. The re-activated processor thereafter resumes the execution of program code in normal manner (step 808 or step 812). In yet another implementation, a hard reset of the simulator environment may re-initialize all simulated processors, thereby re-activating any processors suspended previously. The re-activated processors are then brought back online for code execution in the simulator environment. Decision block 814 and step 816 capture these processes. As pointed out before, the program code continues to be executed on the active processors of the run list even after a processor in idle loop condition is suspended from the run list (step 818).

Based upon the foregoing Detailed Description, it should be appreciated that the present invention provides an innovative scheme for increasing performance in a multi-CPU simulation environment by advantageously avoiding idle loop execution on the target hardware processors of a simulator. Further, by calling the simulator API routine of the present invention at various points in a program code, different processors can be selectively deactivated and re-activated in order to simulate a host of behaviors that a target MP system may exhibit.

It is believed that the operation and construction of the present invention will be apparent from the foregoing Detailed Description. While the system and method shown and described have been characterized as being preferred, it should be readily understood that various changes and modifications could be made therein without departing from the scope of the present invention as set forth in the following claims. For example, the teachings of the present invention can be practiced in conjunction with any target hardware platform including, for example, symmetrical and asymmetrical MP systems, loosely-coupled MP architectures, shared- or dedicated-cache systems, and other high performance computing machines. Also, whereas the use of BRANCH commands has been described in reference to exemplary idle loop conditions, such command implementations are merely illustrative. Furthermore, as alluded to in the foregoing Detailed Description, the program code under simulation may be comprised of any type of software including Operating Systems, application programs, debug tools, et cetera. The simulator API routine may also be implemented to include other arguments for enhanced features, such as timestamp information, duration of suspension, etc. A multi-bit mask feature may be provided as an argument that can target multiple processors for suspension or re-activation. Accordingly, all such modifications, extensions, variations, amendments, additions, deletions, combinations, and the like are deemed to be within the ambit of the present invention whose scope is defined solely by the claims set forth hereinbelow.

What is claimed is:

1. A method of improving performance in a simulator environment operable to simulate a multiprocessor platform with a program running thereon, comprising:
    initializing a list of simulated processors in said simulator environment for executing said program, said simulator environment being effectuated on a host machine having finite computing resources; and
    suspending execution of said program on a particular simulated processor when said program is to enter an idle state on said particular simulated processor, said operation of suspending being effectuated via a simulator application program interface (API), whereby said host machine's computing resources are conserved.

2. The method of improving performance in a simulator environment as set forth in claim 1, wherein said simulator API comprises a routine that is executed on said particular simulated processor.

3. The method of improving performance in a simulator environment as set forth in claim 1, wherein said simulator API comprises a routine that is executed on another simulated processor.

4. The method of improving performance in a simulator environment as set forth in claim 1, wherein said list of simulated processors is modified to indicate that said particular simulated processor is suspended.

5. The method of improving performance in a simulator environment as set forth in claim 4, wherein said list of processors includes an indication that said particular simulated processor is operable to be re-activated responsive to an external event.

6. The method of improving performance in a simulator environment as set forth in claim 5, wherein said external event comprises an interrupt.

7. The method of improving performance in a simulator environment as set forth in claim 4, further comprising the step of re-activating said particular simulated processor.

8. The method of improving performance in a simulator environment as set forth in claim 1, wherein said host machine includes at least one host processor and said simulator environment comprises a single-threaded simulator environment.

9. The method of improving performance in a simulator environment as set forth in claim 1, further comprising the step of continuing to execute said program on remaining simulated processors in said simulator environment.

10. A system for improving performance in a host machine operable to simulate a multiprocessor platform with a program running thereon, comprising:
    means to initialize a list of simulated processors in a simulator environment for executing said program, said simulator environment being effectuated on said host machine having finite computing resources; and
    means for suspending execution of said program on a particular simulated processor when said program is to enter an idle state on said particular simulated processor, wherein said means for suspending includes a simulator application program interface (API) routine, whereby said host machine's computing resources are conserved.

11. The system for improving performance in a host machine as set forth in claim 10, wherein said simulator API routine is operable to be executed on said particular simulated processor.

12. The system for improving performance in a host machine as set forth in claim 10, wherein said simulator API routine is operable to be executed on another simulated processor.

13. The system for improving performance in a host machine as set forth in claim 10, further including means to indicate that said particular simulated processor is suspended.

14. The system for improving performance in a host machine as set forth in claim 13, further including means to indicate that said particular simulated processor is operable to be reactivated responsive to an external event.

15. The system for improving performance in a host machine as set forth in claim 14, wherein said external event comprises an interrupt.

16. The system for improving performance in a host machine as set forth in claim 10, further including means for re-activating said particular simulated processor.

17. The system for improving performance in a host machine as set forth in claim 10, wherein said host machine includes at least one host processor and said simulator environment comprises a single-threaded simulator environment.

18. The system for improving performance in a host machine as set forth in claim 10, further including means for continuing to execute said program on remaining simulated processors in said simulator environment.

19. A resource distribution method operable in a host machine having finite computing resources, said host machine for simulating a multiprocessor platform with a program running thereon, said method comprising:

initializing a list of simulated processors for executing said program;

commencing execution of said program on said simulated processors, wherein each of said simulated processors consumes a portion of said host machine's computing resources pursuant to executing said program; and suspending execution of said program on a particular simulated processor when said program is to enter an idle state on said particular simulated processor, said operation of suspending being effectuated via a simulator application program interface (API), thereby releasing for distribution said host machine's computing resources otherwise consumed by said particular simulated processor.

20. The resource distribution method as set forth in claim 19, wherein said simulator API comprises a routine that is executed on said particular simulated processor.

21. The resource distribution method as set forth in claim 19, wherein said simulator API comprises a routine that is executed on another simulated processor.

22. The resource distribution method as set forth in claim 19, wherein said list of simulated processors is modified to indicate that said particular simulated processor is suspended.

23. The resource distribution method as set forth in claim 22, wherein said list of processors includes an indication that said particular simulated processor is operable to be re-activated responsive to an external event.

24. The resource distribution method as set forth in claim 23, wherein said external event comprises an interrupt.

* * * * *